(12) United States Patent
Yamawaku et al.

(10) Patent No.: US 8,964,350 B2
(45) Date of Patent: Feb. 24, 2015

(54) SUBSTRATE REMOVING METHOD AND STORAGE MEDIUM

(75) Inventors: Jun Yamawaku, Nirasaki (JP); Yohei Yamazawa, Nirasaki (JP)

(73) Assignee: Tokyo Electron Limited (JP)

( * ) Notice: Subject to any disclaimer, the term of this patent is extended or adjusted under 35 U.S.C. 154(b) by 408 days.

(21) Appl. No.: 13/434,263

(22) Filed: Mar. 29, 2012

(65) Prior Publication Data
US 2012/0250213 A1    Oct. 4, 2012

Related U.S. Application Data

(60) Provisional application No. 61/477,642, filed on Apr. 21, 2011.

(30) Foreign Application Priority Data

Mar. 30, 2011 (JP) ................................. 2011-076320

(51) Int. Cl.
*H01L 21/683* (2006.01)
(52) U.S. Cl.
CPC .................................. *H01L 21/6833* (2013.01)
USPC ............................ 361/234; 361/233; 361/220
(58) Field of Classification Search
USPC ......................................... 361/234, 233, 220
See application file for complete search history.

(56) References Cited

U.S. PATENT DOCUMENTS

| | | | |
|---|---|---|---|
| 5,818,682 A * | 10/1998 | Loo ................................ | 361/234 |
| 6,236,555 B1 * | 5/2001 | Leeser .......................... | 361/234 |
| 6,818,560 B1 * | 11/2004 | Koshimizu et al. ........... | 438/706 |
| 7,218,503 B2 * | 5/2007 | Howald ......................... | 361/234 |

FOREIGN PATENT DOCUMENTS

| | | | | |
|---|---|---|---|---|
| JP | 04-230051 | 8/1992 | | |
| JP | 05-226291 | 9/1993 | | |
| JP | 09-213780 | 8/1997 | | |
| JP | 2006202939 A * | 8/2006 | ............ | H01L 21/683 |

* cited by examiner

*Primary Examiner* — Zeev V Kitov
(74) *Attorney, Agent, or Firm* — Cantor Colburn LLP

(57) ABSTRACT

A substrate processing apparatus includes an electrostatic chuck enclosing an electrostatic electrode plate and a chamber having a ground potential and housing the electrostatic chuck. DC discharge is generated between a wafer and the chamber by setting the potential of the electrostatic electrode plate of the electrostatic chuck which is maintained at a first predetermined potential during a plasma etching process to a ground potential after the plasma etching process to increase the absolute value of the potential difference between the wafer and the chamber. DC discharge is then re-generated by applying, to the electrostatic electrode plate, DC voltage having the same potential as a second predetermined potential which is generated at the wafer after the DC discharge is generated, and by increasing the absolute value of the potential difference between the wafer and the chamber. The wafer is then easily removed from the electrostatic chuck.

5 Claims, 6 Drawing Sheets

US 8,964,350 B2

SUBSTRATE REMOVING METHOD AND STORAGE MEDIUM

CROSS-REFERENCE TO RELATED APPLICATIONS

This application is based on and claims priority from Japanese Patent Application No. 2011-076320, filed on Mar. 30, 2011, with the Japanese Patent Office, the disclosure of which is incorporated herein in its entirety by reference. Also, this application claims the benefit of U.S. Provisional Application No. 61/477,642 filed on Apr. 21, 2011, with the United States Patent and Trademark Office, which is herein incorporated by reference in its entirety.

TECHNICAL FIELD

The present disclosure relates to a substrate removing method of removing a substrate electrostatically adsorbed at an electrostatic chuck and a computer-readable storage medium storing a program that, when executed, causes a computer to perform the substrate removing method.

BACKGROUND

A wafer for a semiconductor device as a substrate (hereinafter, a "wafer") is processed with a predetermined process such as, for example, a plasma process in a depressurized processing chamber of a substrate processing apparatus. The wafer is electrostatically adsorbed by an electrostatic chuck disposed in the processing chamber so as not to deviate from a desired position during the predetermined process.

The electrostatic chuck is a planar member made of a high-resistance dielectric material such as, for example, ceramics having an electrostatic electrode plate therein, and the wafer is placed on the upper surface of the electrostatic chuck. When a DC power source is connected to the electrostatic electrode plate to supply a positive DC voltage, a negative potential is generated on the surface of the electrostatic chuck side (hereinafter, a "rear surface") of the placed wafer, and thus, a potential difference is generated between the electrostatic electrode plate and the rear surface of the wafer. However, since the dielectric material of the electrostatic chuck presents between the electrostatic electrode plate and the wafer, electric charges do not move between the electrostatic electrode plate and the wafer, and thus, the potential difference is maintained between the electrostatic electrode plate and the rear surface of the wafer. As a result, the wafer is electrostatically adsorbed at the electrostatic chuck by an electrostatic force caused by the potential difference.

An upper electrode plate with a ground potential is disposed so as to face the electrostatic chuck in the processing chamber of the substrate processing apparatus. Since there exists plasma 51 always between a wafer W and an upper electrode plate 50, when a plasma process is performed for wafer W in the substrate processing apparatus, as shown in FIG. 6A, the electric charges between wafer W and upper electrode plate 50 freely move by the electrons or the cations in plasma 51. As a result, even though the potential of an electrostatic electrode plate 52 (represented by "HV" in the drawings) existing in an electrostatic chuck 53 is set to, for example, 2.5 kV, the potential of wafer W (represented by "Wafer" in the drawings) becomes the same ground potential as the potential of upper electrode plate 50 (represented by "UEL" in the drawings), that is, 0 V.

In order to easily remove wafer W from electrostatic chuck 53 after the plasma process, for example, it has been proposed that voltage having an opposite polarity to the voltage applied during the plasma process is applied to electrostatic electrode plate 52 (see, for example, Japanese Patent Application Laid-Open No. H04-230051) or that the potential of electrostatic electrode plate 52 is changed to 0 V. However, when the potential of electrostatic electrode plate 52 is changed from 2.5 kV to 0 V, since the electric charges do not move between wafer W and electrostatic electrode plate 52 and the potential difference between wafer W and electrostatic electrode plate 52 is maintained, the potential of wafer W is also changed by the same potential as the potential of electrostatic electrode plate 52. That is, as shown in FIG. 6B, the potential of wafer W is changed from 0 V to −2.5 kV.

In this case, since the potential difference between wafer W and upper electrode plate 50 is increased, direct current discharge 54 (hereinafter, "DC discharge") is generated between wafer W and upper electrode plate 50 (FIG. 6C). When DC discharge 54 is generated, the electric charges move between wafer W and upper electrode plate 50, such that the potential difference between wafer W and upper electrode plate 50 is decreased. DC discharge 54 generated between upper electrode plate 50 and wafer W stops when the potential difference between upper electrode plate 50 and wafer W is decreased up to the potential difference in which the discharge can be maintained.

SUMMARY

An exemplary embodiment of the present disclosure provides a substrate removing method. The substrate removing method includes: providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate; maintaining the potential of the electrostatic electrode plate after the plasma process at a first predetermined potential which is the potential of the electrostatic electrode plate during the plasma process; generating DC discharge between the substrate and the chamber by setting the potential of the electrostatic electrode plate to the ground potential and increasing the absolute value of the potential difference between the substrate and the chamber; re-generating the DC discharge between the substrate and the chamber by applying, to the electrostatic electrode plate, DC voltage having the same potential as a second predetermined potential, which is generated on the substrate after the DC discharge is generated at the generating DC discharge process and by increasing the absolute value of the potential difference between the substrate and the chamber; and removing the substrate from the electrostatic chuck.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
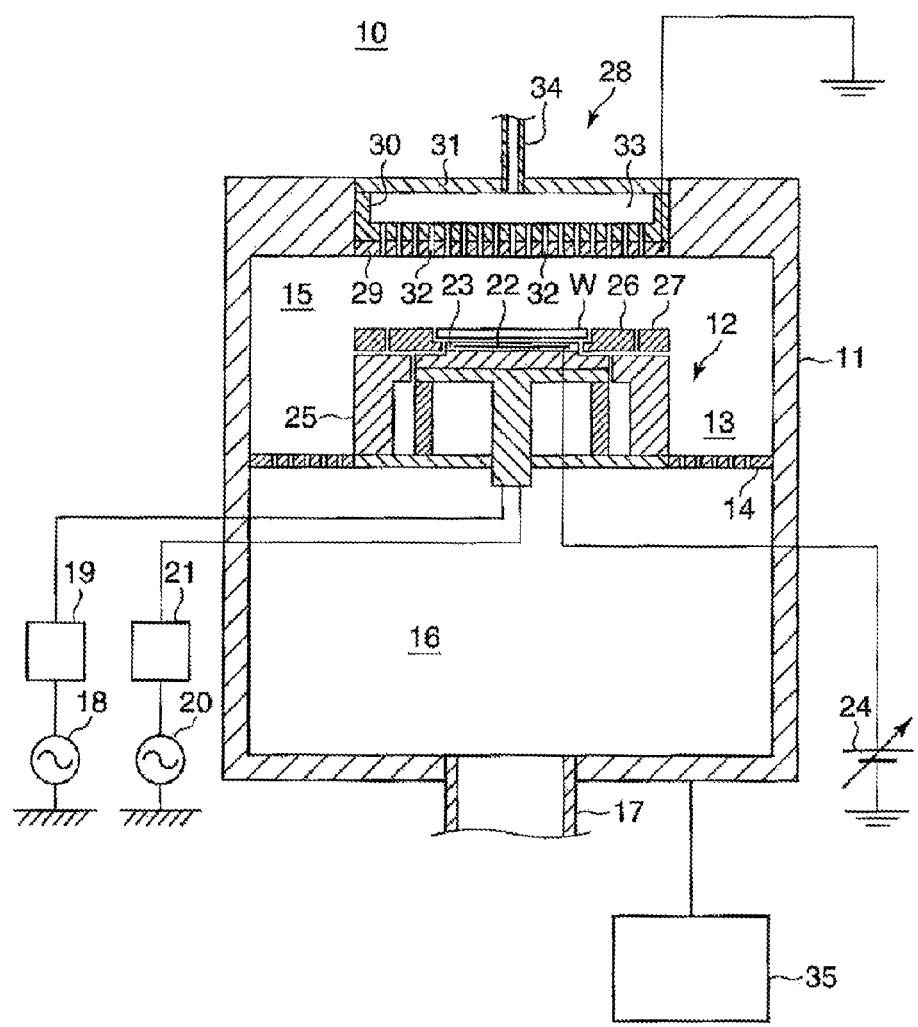
FIG. 1 is a schematic view illustrating the configuration of a substrate processing apparatus in which a substrate removing method according to an exemplary embodiment of the present disclosure is performed.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

When DC discharge 54 is generated, the potential difference between wafer W and upper electrode plate 50 is instantly decreased, and thus, the potential difference is reduced up to a potential difference in which the discharge cannot be maintained, such that DC discharge 54 immediately stops. As a result, since the subsequent movement of the electric charges stops, the potential difference between upper electrode plate 50 and wafer W is not completely resolved and a predetermined potential (hereinafter, a "remaining potential"), for example, −0.5 kV remains on wafer W.

Meanwhile, since the potential of electrostatic electrode plate 52 is set to 0 kV, the absolute value of the potential difference (0.5 kV) remains between wafer W and electrostatic electrode plate 52, and thus, wafer W is electrostatically adsorbed by electrostatic chuck 53. Therefore, there is a problem in that wafer W cannot be easily removed from electrostatic chuck 53.

The present disclosure has been made in an effort to provide a substrate removing method capable of easily removing a substrate from an electrostatic chuck and a storage medium storing the substrate removing method.

An exemplary embodiment of the present disclosure provides a substrate removing method. The substrate removing method includes: providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate; maintaining the potential of the electrostatic electrode plate after the plasma process at a first predetermined potential which is the potential of the electrostatic electrode plate during the plasma process; generating DC discharge between the substrate and the chamber by setting the potential of the electrostatic electrode plate to the ground potential and by increasing the absolute value of the potential difference between the substrate and the chamber; re-generating the DC discharge between the substrate and the chamber by applying, to the electrostatic electrode plate, DC voltage having the same potential as a second predetermined potential, which is generated at the substrate after the DC discharge is generated at the generating DC discharge process and by increasing the absolute value of the potential difference between the substrate and the chamber; and removing the substrate from the electrostatic chuck.

The substrate removing method may further include, before the removing process, changing the potential of the electrostatic electrode plate after the DC discharge is generated at the re-generating DC discharge to the ground potential.

In the substrate removing method, a pressure in the processing chamber at the re-generating DC discharge process may be 13.3 Pa (100 mTorr) or more.

In the substrate removing method, the potential of the DC voltage applied to the electrostatic electrode plate before the plasma process may be 1,000 V or more.

In the substrate removing method, the potential of the DC voltage applied to the electrostatic electrode plate before the plasma process may be 2,000 V or more.

Another exemplary embodiment of the present disclosure provides a computer-readable storage medium storing a program that, when executed, causes a computer to perform a substrate removing method. The substrate removing method includes: providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate; maintaining the potential of the electrostatic electrode plate after the plasma process at a first predetermined potential which is the potential of the electrostatic electrode plate during the plasma process; generating DC discharge between the substrate and the chamber by setting the potential of the electrostatic electrode plate to the ground potential and by increasing the absolute value of the potential difference between the substrate and the chamber; re-generating the DC discharge between the substrate and the chamber by applying, to the electrostatic electrode plate, DC voltage having the same potential as a second predetermined potential which is generated at the substrate after the DC discharge is generated at the generating DC discharge process and by increasing the absolute value of the potential difference between the substrate and the chamber; and removing the substrate from the electrostatic chuck.

According to the exemplary embodiments of the present disclosure, the DC discharge between the substrate and the chamber is re-generated by applying, to the electrostatic electrode plate, DC voltage having the same potential as the second predetermined potential, which is generated at the substrate after the DC discharge is generated in the first discharging step to increase the absolute value of the potential difference between the substrate and the chamber (including the upper electrode plate). When the DC discharge is re-generated, the potential of the substrate becomes the second predetermined potential. In this case, since the potential of the electrostatic electrode plate is the second predetermined potential, the potential of the substrate and the potential of the electrostatic electrode plate may be the same potential as each other. As a result, the substrate is not electrostatic-sucked at the electrostatic chuck and the substrate may be easily removed from the electrostatic chuck.

Hereinafter, exemplary embodiments of the present disclosure will be described with reference to the accompanying drawings.

FIG. 1 is a schematic view illustrating the configuration of a substrate processing apparatus in which a substrate removing method is performed according to an exemplary embodiment of the present disclosure. A wafer for a semiconductor device as a substrate is processed with a predetermined process such as, for example, a plasma etching process in a depressurized processing chamber of a substrate processing apparatus.

In FIG. 1, a substrate processing apparatus 10 includes a chamber 11 having a ground potential and housing a wafer W having a diameter of, for example, 300 mm, and a cylindrical susceptor 12 where wafer W is placed on the upper surface thereof is disposed in chamber 11. In substrate processing apparatus 10, a side exhaust line 13 is formed along the inside wall of chamber 11 and the side surface of susceptor 12. An exhaust plate 14 is disposed in the middle of side exhaust line 13.

Exhaust plate 14 is a planar member having a plurality of through-holes and serves as a diaphragm dividing the inside of chamber 11 into an upper portion and a lower portion. Plasma is generated at the inner space of an upper portion 15 (a "processing chamber") in chamber 11 divided by exhaust plate 14, as described below. An exhaust pipe 17 discharging gas in chamber 11 is connected to a lower portion 16 (an "exhaust chamber (manifold)") in chamber 11. Exhaust plate 14 captures and reflects the plasma generated in processing chamber 15 to prevent the plasma from being leaked to manifold 16.

A turbo molecular pump (TMP) and a dry pump (DP) (both not shown) are connected to exhaust pipe 17 and these pumps vacuum-suck the inside of chamber 11 to depressurize the inside of chamber 11. Specifically, the DP depressurizes the inside of chamber 11 up to a middle vacuum state from atmospheric pressure and the TMP, in cooperation with the DP, depressurizes the inside of chamber 11 up to a high vacuum state of pressure lower than the middle vacuum state. The pressure in chamber 11 is controlled by an APC valve (not shown).

A first high frequency power source 18 is connected to susceptor 12 in chamber 11 through a first matching device 19 and supplies a high frequency power for an ion injection of a relatively low frequency, for example, 2 MHz. A second high frequency power source 20 is connected to susceptor 12 through a second matching device 21 and supplies a high frequency power for plasma generation of a relatively high frequency, for example, 40 MHz. Susceptor 12 to which two kinds of high frequency powers are supplied functions as a lower electrode.

A step is formed at the upper periphery of susceptor 12 so that the center of susceptor 12 protrudes toward the upper side in the drawing. Disk shaped electrostatic chuck 23 made of a dielectric material such as, for example, ceramics and having electrostatic electrode plate 22 therein, is disposed at the front end of the center of susceptor 12. When a DC power source 24 is connected to electrostatic electrode plate 22 and positive DC voltage is applied to electrostatic electrode plate 22, a negative potential is generated on the surface of electrostatic chuck 23 side of wafer W (a "rear surface"), and thus, a potential difference is generated between electrostatic electrode plate 22 and the rear surface of wafer W. The potential difference generates a Coulomb force which is the electrostatic force between electrostatic electrode plate 22 and wafer W, and thus, wafer W is adsorbed and held at electrostatic chuck 23 by the Coulomb force.

Susceptor 12 includes a cooling mechanism (not shown) having a coolant flow channel therein and the cooling mechanism absorbs the heat of wafer W where a temperature is increased by contacting with plasma thereby preventing the temperature of wafer W from being increased to a desired temperature or more.

Susceptor 12 is constituted with a conductor such as, for example, aluminum in consideration of thermal conductive efficiency or an electrode function. In order to prevent the conductor from being exposed at processing chamber 15 by which the plasma is generated, the side of susceptor 12 is covered with a side protective member 25 made of a dielectric material such as, for example, quartz ($SiO_2$).

Above susceptor 12, an annular focus ring 26 is placed at the step of susceptor 12 or side protective member 25 so as to surround wafer W adsorbed and held at electrostatic chuck 23, and a shield ring 27 is placed at side protective member 25 so as to surround focus ring 26. Focus ring 26 is made of silicon (Si) or silicon carbide (SiC) and a distribution area of the plasma is expanded above wafer W and focus ring 26.

A shower head 28 is disposed at the ceiling part of chamber 11 so as to face susceptor 12. Shower head 28 includes a disk-shaped upper electrode plate 29, a cooling plate 30 detachably suspending and holding upper electrode plate 29, and a cover 31 covering cooling plate 30. Disk-shaped upper electrode plate is made of a conductor of which the surface is covered with an insulating film or a single semiconductor such as, for example, silicon. Since upper electrode plate 29 is formed by a disk-shaped member having a plurality of gas holes 32 passing therethrough in a thickness direction and electrically grounded, the potential of upper electrode plate 29 is the ground potential. A buffer chamber 33 is installed in cooling plate 30 and a processing gas introducing pipe 34 is connected to buffer chamber 33.

Substrate processing apparatus 10 further includes a controller 35 that controls the operation of each element to perform a plasma etching process according to a program stored in, for example, a built-in memory. Specifically, controller 35 controls the operation of each element to introduce the processing gas supplied to buffer chamber 33 through processing gas introducing pipe 34 into the inner space of processing chamber 15 and excite the introduced processing gas with high frequency power applied from second high frequency power source 20 to the inner space of processing chamber 15 through susceptor 12 to generate plasma. Controller 35 performs the plasma etching process onto wafer W by injecting cations in the plasma toward wafer W by the high frequency power for ion injection applied from first high frequency power source 18 to susceptor 12 or by making radicals in the plasma to reach wafer W.

Figure 2:
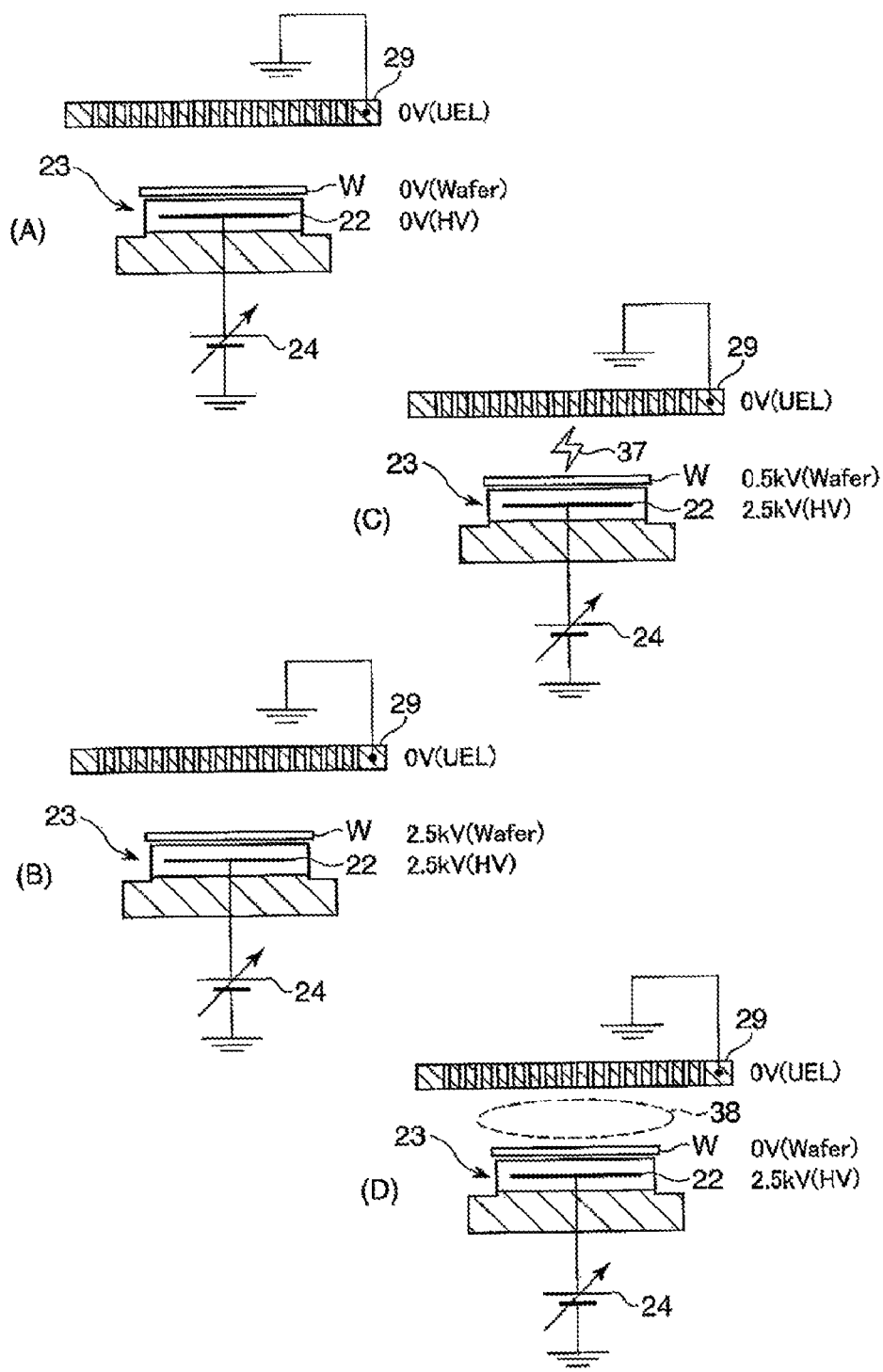
FIG. 2 is a view for describing an electrostatic adsorbing process of a wafer before and during a plasma etching process in the substrate processing apparatus of FIG. 1.

FIG. 2 is a view for describing an electrostatic adsorbing process of wafer W before and during a plasma etching process in the substrate processing apparatus of FIG. 1. In the present exemplary embodiment, since both chamber 11 and upper electrode plate 29 are the ground potentials, upper electrode plate 29 may constitute a part of chamber 11, and is close to wafer W, the potential difference between wafer W and chamber 11 will be described to be represented by the potential difference between wafer W and upper electrode plate 29 hereinafter.

First, wafer is placed on electrostatic chuck 23, while DC voltage from DC power source 24 is not applied to electrostatic electrode plate 22 in electrostatic chuck 23 of susceptor 12 and the potential of electrostatic electrode plate 22 is maintained at the ground potential, that is, 0 V. Herein, the potential of placed wafer W is the ground potential, that is, 0 V (FIG. 2A).

Subsequently, the inside of chamber 11 is depressurized and the processing gas is introduced in processing chamber 15 of chamber 11. DC power source 24 applies a positive DC voltage, for example, DC voltage of 2.5 kV to electrostatic electrode plate 22 (FIG. 2B). However, since the ceramics of electrostatic chuck 23 exist between electrostatic electrode plate 22 and wafer W, the electric charges do not move between electrostatic electrode plate 22 and wafer W, and the potential difference between electrostatic electrode plate 22 and wafer W is maintained. Herein, since the potential of electrostatic electrode plate 22 is changed from the ground potential to 2.5 kV, the potential of wafer W is also changed by 2.5 kV as the absolute value and changed from the ground potential to 2.5 kV (FIG. 2B).

Subsequently, if the absolute value of the potential difference between wafer W and upper electrode plate 29 is increased, DC discharge 37 is generated between wafer W and upper electrode plate 29 (FIG. 2C). Herein, when DC discharge 37 is generated, the electric charges move between wafer W and upper electrode plate 29, such that the potential difference between wafer W and upper electrode plate 29 is decreased. When DC discharge 37 is generated, since the potential difference between wafer W and upper electrode plate 29 is instantly decreased, the potential difference is reduced up to a potential difference in which the discharge cannot be maintained, such that DC discharge 37 immediately stops. As a result, since the movement of the electric charges immediately stops, the potential difference between wafer W and upper electrode plate 29 is not completely resolved and a predetermined potential (hereinafter, a "remaining potential after DC discharge"), for example, the potential of 0.5 kV remains on wafer W.

Meanwhile, since the DC voltage of 2.5 kV is applied to electrostatic electrode plate 22, the potential of electrostatic electrode plate 22 still remains at 2.5 kV and is different from the remaining potential after the DC discharge, and thus, the absolute value of, for example, 2.0 kV, of the potential difference between wafer W and electrostatic electrode plate 22 is generated after the DC discharge and the electrostatic force is generated based on the potential difference. As a result, wafer W is adsorbed at electrostatic chuck 23.

With respect to the remaining potential after the DC discharge, since the potential difference between wafer W and upper electrode plate 29 is larger than a potential difference by which the DC discharge can be generated during the potential of wafer W changes from 2.5 kV up to the remaining potential after DC discharge, the DC discharge may be maintained. Meanwhile, since the potential of upper electrode plate 29 therebetween is the ground potential, when the potential difference between wafer W and upper electrode plate 29 is larger than an absolute value of the remaining potential after DC discharge, the DC discharge may be generated. That is, the absolute value of the remaining potential after DC discharge becomes a minimum value of the potential difference by which the DC discharge can be generated. In the present exemplary embodiment, a case where the absolute value of the remaining potential after DC discharge is set to 0.5 kV will be described below.

Subsequently, the plasma etching process is performed onto wafer W with plasma 38 by introducing the processing gas to the inner space of processing chamber 15 and exciting the introduced processing gas with the high frequency power to generate plasma 38. In this case, the electric charges freely move between wafer W and upper electrode plate 29 by the electrons or the cations in plasma 38. As a result, the potential of wafer W which is the remaining potential after DC discharge becomes the same ground potential as the potential of upper electrode plate 29 (0 V) (FIG. 2D). During the plasma etching process, the DC voltage of 2.5 kV is applied to electrostatic electrode plate 22, and thus, 2.5 kV is maintained as the potential of electrostatic electrode plate 22.

Figure 3:
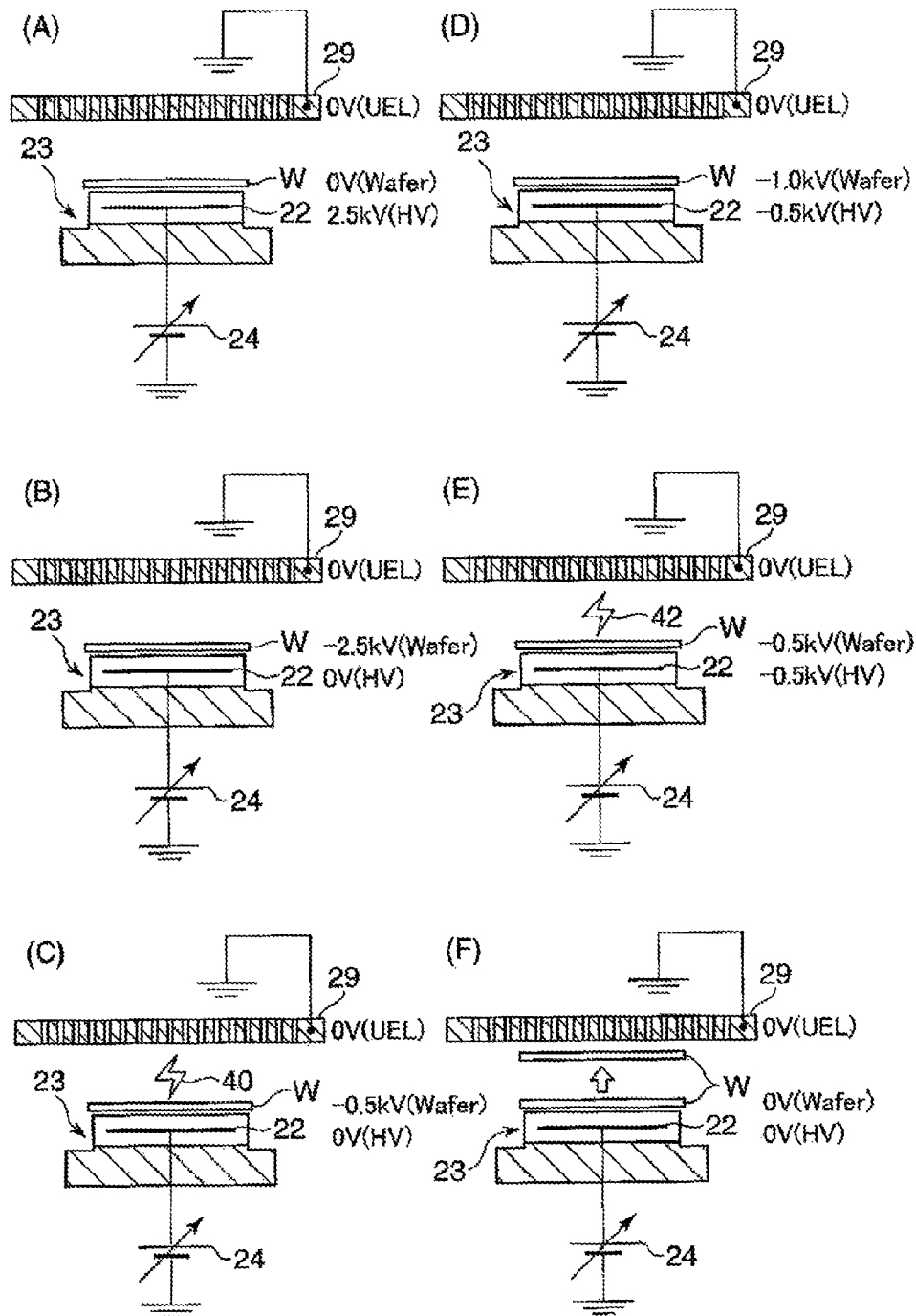
FIG. 3 is a view for describing a wafer removing process as the substrate removing method according to the exemplary embodiment of the present disclosure.

FIG. 3 is a view for describing a wafer removing process as the substrate removing method according to the exemplary embodiment of the present disclosure.

In substrate removing apparatus 10 of FIG. 1, the plasma etching process ends by stopping supplying the high frequency power for plasma generation to susceptor 12. At this time, since the application of the voltage of 2.5 kV (first predetermined potential) to electrostatic electrode plate 22 is maintained, the potential of 2.5 kV is maintained as the potential of electrostatic electrode plate 22 (potential maintaining step). Meanwhile, the potential of wafer W is maintained at the same ground potential as the potential of upper electrode plate 29 (0 V) (FIG. 3A).

Subsequently, the application of the DC voltage to electrostatic electrode plate 22 stops and the potential of electrostatic electrode plate 22 is changed from 2.5 kV to be set to the ground potential. Herein, as described above, since the potential difference between electrostatic electrode plate 22 and wafer W is maintained, the potential of wafer W is also changed only by 2.5 kV (absolute value of the first predetermined potential) to be changed from the ground potential to −2.5 kV (FIG. 3B). In this case, since the potential of upper electrode plate 29 is maintained at the ground potential, the absolute value of the potential difference between wafer W and upper electrode plate 29 is increased and becomes 2.5 kV. Since the absolute value of the potential difference of 2.5 kV is larger than that of the remaining potential before the DC discharge, that is, 0.5 kV which is the minimum value of the potential difference by which the DC discharge can be generated, DC discharge 40 is generated between wafer W and upper electrode plate 29 (FIG. 3C) (first discharging step). When DC discharge 40 is generated, the absolute value of the potential difference between wafer W and upper electrode plate 29 is decreased up to 0.5 kV. However, since the potential of wafer W before the DC discharge 40 is generated is −2.5 kV and the potential of upper electrode plate 29 is maintained at the ground potential, the potential of wafer W after the DC discharge 40 is generated (hereinafter, "another remaining potential after DC discharge") becomes −0.5 kV (second predetermined potential). At this time, since the potential of electrostatic electrode plate 22 is the ground potential, the potential difference between electrostatic electrode plate 22 and wafer W becomes 0.5 kV.

Subsequently, DC voltage of −0.5 kV which is the same potential as another remaining potential after DC discharge is applied to electrostatic electrode plate 22 from DC power source 24, and the potential of electrostatic electrode plate 22 is changed from the ground potential to −0.5 kV. Herein, since the potential difference between electrostatic electrode plate 22 and wafer W after the generation of DC discharge 40 is maintained, the potential of wafer W is also changed only by 0.5 kV as the absolute value to be changed from −0.5 kV to −1.0 kV (FIG. 3D). At this time, since the potential of upper electrode plate 29 is still maintained at the ground potential, the absolute value of the potential difference between wafer W and upper electrode plate 29 is increased to become 1.0 kV. Since the absolute value of the potential difference of 1.0 kV is larger than 0.5 kV which is the minimum value of the potential difference by which the DC discharge can be generated, DC discharge 42 is generated between wafer W and upper electrode plate 29 (FIG. 3E) (second discharging step). When DC discharge 42 is generated, the absolute value of the potential difference between wafer W and upper electrode plate 29 is decreased up to 0.5 kV as in the case where DC discharge is generated. However, since the potential of wafer W before DC discharge 42 is generated is −1.0 kV and the potential of upper electrode plate 29 is maintained at the ground potential, the potential of wafer W after DC discharge 42 is generated becomes the same potential as another remaining potential after DC discharge (−0.5 kV). In this case, since DC voltage of −0.5 kV is applied to electrostatic electrode plate 22, the potential of electrostatic electrode plate 22 is −0.5 kV and the potentials of wafer W and electrostatic electrode plate 22 become the same potential (−0.5 kV).

Subsequently, the application of the DC voltage to electrostatic electrode plate 22 stops and the potential of electrostatic electrode plate 22 is changed from −0.5 kV to the ground potential (potential change step). Even in this case, since the potential difference between electrostatic electrode plate 22 and wafer W is maintained, the potential of wafer W is also changed only by 0.5 kV to be changed from −0.5 kV to the ground potential. Thereafter, wafer W is removed by lifting wafer W by, for example, pins (not shown) protruding from electrostatic chuck 23 (FIG. 3F) and by carrying out wafer W from processing chamber 15 by an arm (not shown) entering into processing chamber 15 (removing step) and the process ends.

In substrate processing apparatus 10, no resistance material is interposed between DC power source 24 and electrostatic electrode plate 22 and thus the electric charges of DC power source 24 and electrostatic electrode plate 22 move rapidly. Accordingly, in the process, a time required for the change in the potential of electrostatic electrode plate 22 is less than one second. That is, in order to set and change electrostatic electrode plate 22 to a desired value, the application of the DC voltage of a desired value to electrostatic electrode plate 22 may be maintained for one second or more.

According to the wafer removing process of FIG. 3, the absolute value of the potential difference between wafer W and upper electrode plate 29 is increased up to 1.0 kV by applying, to electrostatic electrode plate 22, the DC voltage of −0.5 kV which is the same potential as another remaining potential after DC discharge which is generated at wafer W after DC discharge is generated, to thereby re-generate DC discharge 42 between wafer W and upper electrode plate 29. When DC discharge 42 is re-generated, the potential of wafer W becomes another remaining potential (−0.5 kV) after the DC discharge again. In this case, since the potential of upper electrode plate 22 is −0.5 kV, the potentials of wafer W and electrostatic electrode plate 22 may be the same potential as each other. That is, since the potential difference between wafer W and electrostatic electrode plate 22 may be removed, wafer W is not electrostatically adsorbed at electrostatic chuck 23 and may be easily removed from electrostatic chuck 23.

In the wafer removing process of FIG. 3, after DC discharge 42 is re-generated, the potential of electrostatic electrode plate 22 is changed to the ground potential before removing wafer W from electrostatic chuck 23. At this time, since the potential difference between electrostatic electrode plate 22 and wafer W is maintained, the potential of wafer W is also changed to the ground potential. As a result, in a state where wafer W does not have the electric charges, that is, the state where an abnormal discharge cannot be generated at wafer W, wafer W may be removed from electrostatic chuck 23.

In the aforementioned wafer removing process of FIG. 3, the absolute value of the remaining potential after DC discharge or another remaining potential after DC discharge is 0.5 kV, but the absolute value of the remaining potential after DC discharge or another remaining potential after DC discharge is not limited to 0.5 kV and may be changed according to the pressure of chamber 11 or a kind of gas included in the processing gas.

Figure 4:
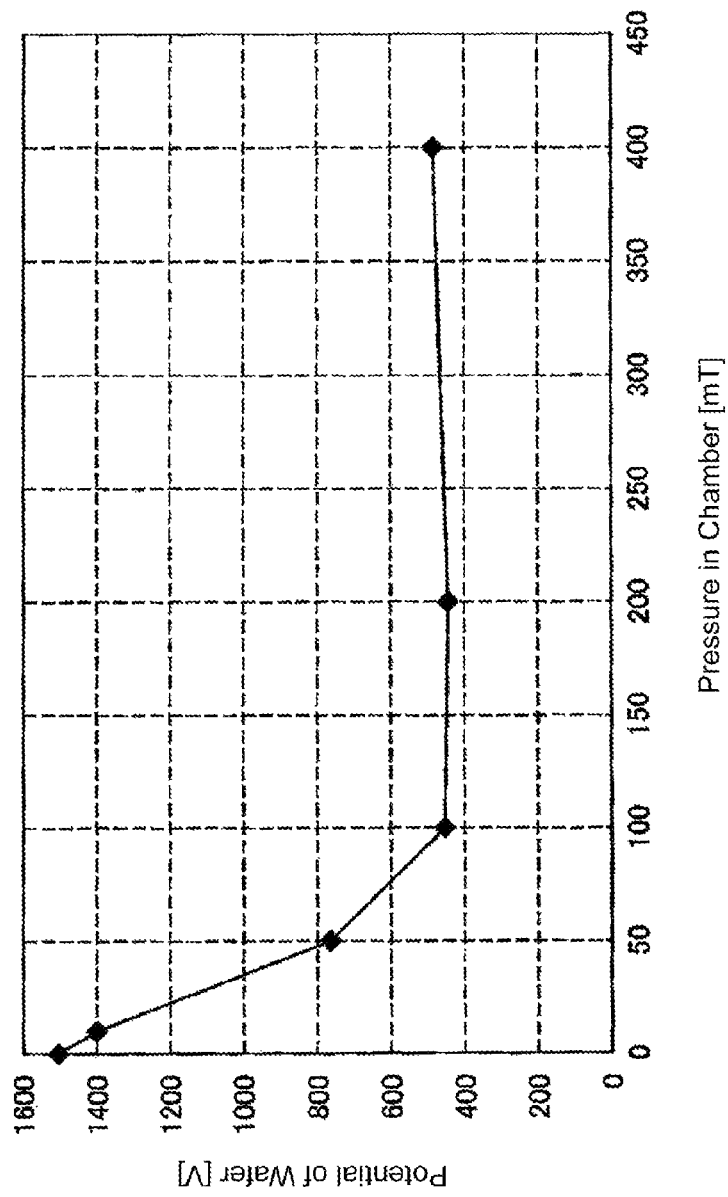
FIG. 4 is a graph illustrating the relationship between a remaining potential after DC discharge and a pressure in a chamber, before a plasma etching process.

FIG. 4 is a graph illustrating a relationship between a remaining potential after DC discharge and a pressure in a chamber before a plasma etching process. In the graph of FIG. 4, a vertical axis represents the potential of wafer W which is the remaining potential after DC discharge and a horizontal axis represents a pressure in chamber 11. DC voltage of 2.5 kV is applied to electrostatic electrode plate 22 from DC power source 24.

As described above, when the potentials of wafer W and electrostatic electrode plate 22 are the ground potential and the DC voltage of 2.5 kV is applied to electrostatic electrode plate 22, the potential difference between electrostatic electrode plate 22 and wafer W is maintained, and thus, the potential of wafer W also becomes 2.5 kV and the absolute value of the potential difference between wafer W and upper electrode plate 29 is increased. As a result, DC discharge 37 is generated between wafer W and upper electrode plate 29, such that the potential difference between wafer W and upper electrode plate 29 is decreased and the potential of wafer W is close to the potential of upper electrode plate 29 which is the ground potential. As shown in the graph of FIG. 4, as the pressure in chamber 11 is decreased, the remaining potential after DC discharge in wafer W is increased. That is, the potential of wafer W was not close to the potential of upper electrode plate 29 which is the ground potential. This is because DC discharge 37 is hardly generated and the electric charges hardly move between wafer W and upper electrode plate 29 when the pressure of chamber 11 is low.

Meanwhile, as the pressure in chamber 11 is increased, the remaining potential after DC discharge in wafer W is decreased and when the pressure of chamber 11 is 100 mTorr (13.3 Pa) or more, the remaining potential after DC discharge is uniformly about 500 V (0.5 kV). This is because DC discharge 37 caused by the potential difference between wafer W and upper electrode plate 29 is easily generated in processing chamber 15 and thus the electric charges easily move between wafer W and upper electrode plate 29, such that the potential of wafer W is close to the potential of upper electrode plate 29, when the pressure in chamber 11 is high.

Accordingly, when the pressure in chamber 11 is 100 mTorr or more, DC discharge 37 may be certainly generated and the absolute value of the remaining potential after DC discharge may be decreased.

The present inventors confirmed that the remaining potential after DC discharge becomes 0.42 kV when DC discharge 37 is generated by using the processing gas which includes argon gas (Ar) as a main gas, and that the remaining potential after DC discharge becomes 0.46 kV when DC discharge 37 is generated by using the processing gas which includes oxygen gas ($O_2$) as a main gas, while applying the DC voltage of 2.5 kV to electrostatic electrode plate 22 from DC power source 24 and setting the pressure in chamber 11 to 200 mTorr, before the plasma etching process. That is, the present inventors confirmed that the remaining potential after DC discharge is changed according to a kind of gas included in the processing gas.

Figure 5:
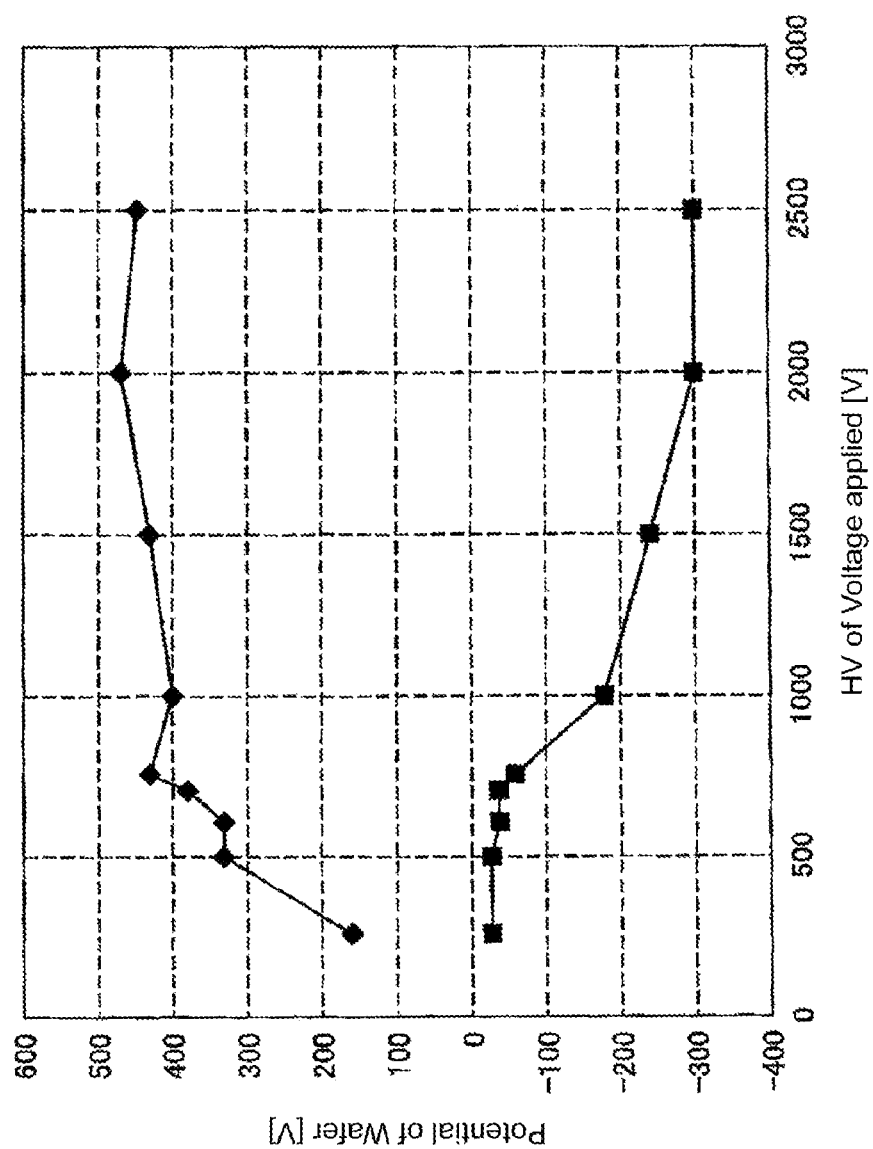
FIG. 5 is a graph illustrating the relationship between DC voltage which is applied to an electrostatic electrode plate and a potential of a wafer after the DC discharge.
Figure 6:
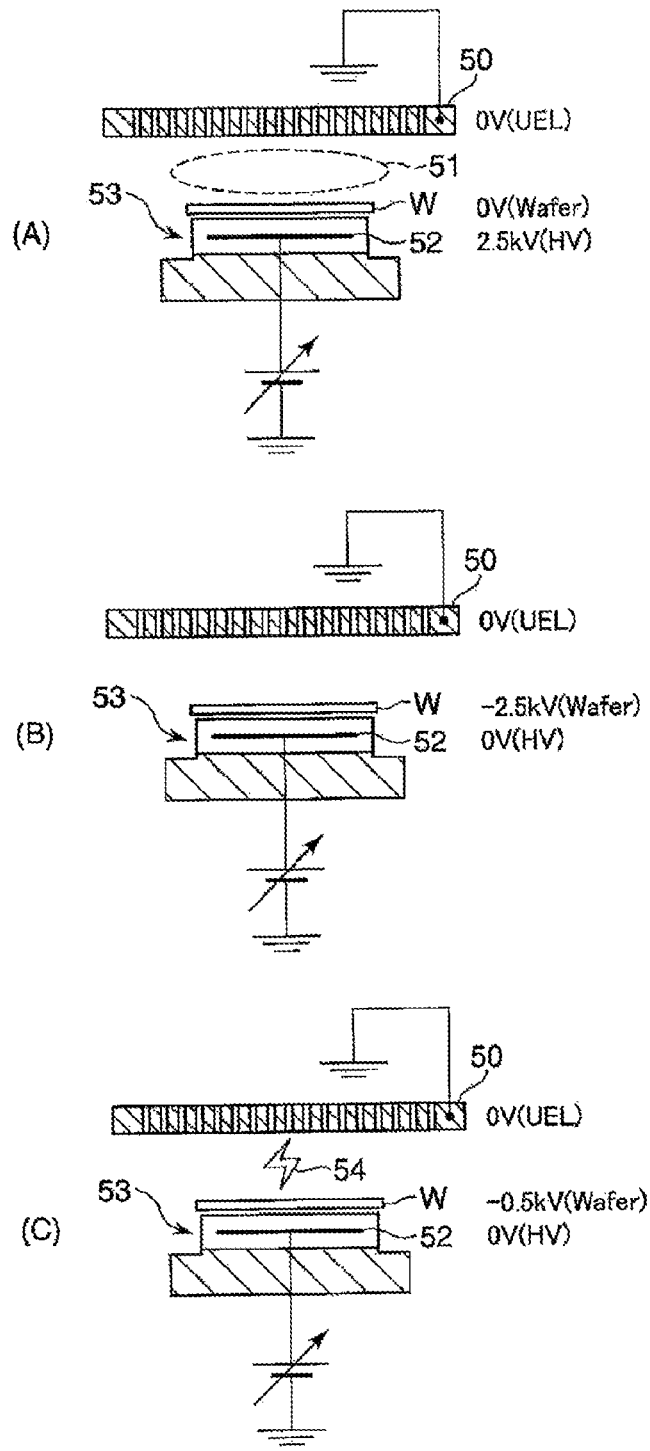
FIG. 6 is a view for describing a substrate removing method in the related art.

FIG. 5 is a graph illustrating a relationship between DC voltage which is applied to electrostatic electrode plate 22 and a potential of a wafer after generation of DC discharge. In the graph of FIG. 5, a vertical axis represents the potential of wafer W and a horizontal axis represents the potential of the DC voltage which is applied to electrostatic electrode plate 22 before or after the plasma etching process. "♦" represents the potential of wafer W after DC discharge 37 is generated (the remaining potential after DC discharge) when the DC voltage is applied to electrostatic electrode plate 22 before the plasma etching process (corresponding to states of FIGS. 2B and 2C), and "■" represents the potential of wafer W after DC discharge 40 is generated (another remaining potential after DC discharge) when the potential of electrostatic electrode plate 22 is set to the ground potential from the first predetermined potential after the plasma etching process (corresponding to states of FIGS. 3B and 3C).

First, from the distribution of "♦" in the graph of FIG. 5, when the potential of the DC voltage applied to electrostatic electrode plate 22 before the plasma etching process is less than 1,000 V, a difference between the potential of electrostatic electrode plate 22 and the potential of wafer W does not occur. When the potential of electrostatic electrode plate 22 is low, the potential of wafer W also becomes low, so that the potential difference between wafer W and upper electrode plate 29 is decreased, and as a result, DC discharge 37 is hardly generated between wafer W and upper electrode plate 29 and the potential of wafer W is minimally changed.

Meanwhile, before the plasma etching process, when the potential of the DC voltage applied to electrostatic electrode plate 22 is 1,000 V or more, the potential of wafer W converges at about 400 V to 500 V regardless of the potential of electrostatic electrode plate 22. This is because the higher the potential of electrostatic electrode plate 22, the higher the potential of wafer W is, so that the potential difference between wafer W and upper electrode plate 29 is increased, and as a result, DC discharge 37 is certainly generated between wafer W and upper electrode plate 29 and the change in the potential of wafer W to the potential capable of maintaining DC discharge 37 (remaining potential after DC discharge) stops.

Accordingly, in order to certainly generate DC discharge 37 between wafer W and upper electrode plate 29 before the plasma etching process, the potential of the DC voltage applied to electrostatic electrode plate 22 before the plasma etching process becomes 1,000 V.

Next, from the distribution of "■" in the graph of FIG. 5, when the potential of the DC voltage applied to electrostatic electrode plate 22 is less than 1,000 V after the plasma etching process, the potential of wafer W is almost the same as potential of electrostatic electrode plate 22 which is the ground potential. As described above, this is because DC discharge 37 is hardly generated between wafer W and upper electrode plate 29 when the potential of electrostatic electrode plate 22 is relatively low before the plasma etching process, and while the potential of wafer W is not excessively changed, a state where the potential of electrostatic electrode plate 22 is almost the same as the potential of wafer W is maintained even after the plasma etching process.

Meanwhile, after the plasma etching process, when the potential of the DC voltage applied to electrostatic electrode plate 22 is 1,000 V or more, a difference between the potential of wafer W and the potential of electrostatic electrode plate 22 which is the ground potential, is increased and particularly, in case of 2,000 V or more, the potential of wafer W converges at a constant value. As described above, this is because DC discharge 37 is certainly generated between wafer W and upper electrode plate 29 when the potential of electrostatic electrode plate 22 is relatively high before the plasma etching process, so that the potential of wafer is largely changed so as to be close to the potential of upper electrode plate 29 which is the ground potential. As a result, the potential difference between wafer W and electrostatic electrode plate 22 is increased and the potential difference is maintained even after DC discharge 40 is generated after the plasma etching process.

After the plasma etching process, when the potential of the DC voltage applied to electrostatic electrode plate 22 is 2,000 V or more, the potential of wafer W converges at a constant value. This is because, since the potential difference between wafer W and upper electrode plate 29 is increased, DC discharge 37 is more certainly generated, and thus, the potential of wafer W converges to the potential capable of maintaining DC discharge 37 (remaining potential after DC discharge). As a result, the state where the potential of wafer W converges to the remaining potential after DC discharge is reflected in the potential of wafer W after DC discharge 40 is generated after the plasma etching process.

Accordingly, in order to ensure the generation of DC discharge 37 between wafer W and upper electrode plate 29 before the plasma etching process, the potential of the DC voltage applied to electrostatic electrode plate 22 before the plasma etching process needs to be set to 2,000 V.

As described above, the present disclosure has been described by using the exemplary embodiments, but the present disclosure is not limited to the exemplary embodiments.

The object of the present disclosure is also achieved by a storage medium storing a software program implementing a function of the aforementioned exemplary embodiment to, for example, a computer, and by reading and executing the program stored in the storage medium by a CPU of the computer.

In this case, the program itself read from the storage medium implements the function of the aforementioned exemplary embodiment, such that the program and the storage medium storing the program configure the present disclosure.

Examples of the storage medium for storing the program may include a RAM, an NV-RAM, a floppy disk (registered trademark), a hard disk, an optical magnetic disk, an optical disk such as CD-ROM, CD-R, CD-RW, and DVD (DVD-ROM, DVD-RAM, DVD-RW, DVD+RW), a magnetic tape, a nonvolatile memory card, other ROMs, which can store a program. The program may be supplied to the computer by being downloaded from other computers or databases (not shown) which are connected through the Internet, a commercial network, a local area network (LAN).

The function of the exemplary embodiments may be implemented by executing the program read by the CPU of the computer, and by performing a part of or the entire actual process by, for example, an operating system (OS) operating on the CPU based on the instruction of the program.

After the program read from the storage medium is stored in the memory installed on an extension board inserted in the computer or an extension unit connected to the computer, the CPU installed on the extension board or the extension unit performs a part of or the entire actual process based on the instruction of the program, and the function of the aforementioned exemplary embodiments may also be implemented by these processes.

The program may be in an object code, a program executed by an interpreter, and script data supplied to the OS.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate removing method comprising:
providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate;
maintaining the potential of the electrostatic electrode plate after the plasma process is completed at a first predetermined potential which is the potential of the electrostatic electrode plate during the plasma process;
setting the potential of the electrostatic electrode plate to the ground potential to increase the absolute value of the potential difference between the substrate and the chamber thereby generating DC discharge between the substrate and the chamber;
applying, to the electrostatic electrode plate, DC voltage having the same potential as a second predetermined potential which is generated on the substrate after the DC discharge is generated at the setting to increase the absolute value of the potential difference between the substrate and the chamber again thereby re-generating DC discharge between the substrate and the chamber such that there exists substantially no potential difference between the substrate and the electrostatic electrode plate;
re-setting the potential of the electrostatic electrode plate to the ground potential such that there exists substantially no potential difference between the substrate and the chamber; and
removing the substrate from the electrostatic chuck while there exists substantially no potential difference between the substrate and the chamber.

2. The substrate removing method of claim 1, wherein a pressure in the chamber at the re-generating DC discharge process is at least 13.3 Pa (100 mTorr) or more.

3. The substrate removing method of claim 1, wherein the potential of the DC voltage applied to the electrostatic electrode plate before the plasma processing is 1,000 V or more.

4. The substrate removing method of claim 3, wherein the potential of the DC voltage applied to the electrostatic electrode plate before the plasma processing is 2,000 V or more.

5. A non-transitory computer-readable storage medium storing a program that, when executed, causes a computer to perform a substrate removing method comprising:
providing a substrate processing apparatus including an electrostatic chuck made of a dielectric material enclosing an electrostatic electrode plate to which DC voltage is applied, and a chamber having a ground potential and housing the electrostatic chuck on which a substrate is placed to be electrostatically adsorbed by the electrostatic chuck, and a plasma process is performed on the substrate;
maintaining the potential of the electrostatic electrode plate after the plasma process is completed at a first predetermined potential which is the potential of the electrostatic electrode plate during the plasma process;
setting the potential of the electrostatic electrode plate to the ground potential to increase the absolute value of the potential difference between the substrate and the chamber thereby generating DC discharge between the substrate and the chamber;
applying, to the electrostatic electrode plate, DC voltage having the same potential as a second predetermined potential which is generated at the substrate after the DC discharge is generated at the setting to increase the absolute value of the potential difference between the substrate and the chamber again thereby re-generating DC discharge between the substrate and the chamber such that there exists substantially no potential difference between the substrate and the electrostatic electrode plate;
re-setting the potential of the electrostatic electrode plate to the ground potential such that there exists substantially no potential difference between the substrate and the chamber; and
removing the substrate from the electrostatic chuck while there exists substantially no potential difference between the substrate and the chamber.

* * * * *